United States Patent
Kim et al.

(10) Patent No.: US 11,315,817 B2
(45) Date of Patent: Apr. 26, 2022

(54) APPARATUS FOR TRANSFERRING WAFER, METHOD FOR TRANSFERRING WAFER USING THE SAME WITH THREE SENSORS

(71) Applicant: Samsung Electronics Co., Ltd., Suwon-si (KR)

(72) Inventors: Euijin Kim, Seoul (KR); Hyungjong Kim, Seoul (KR); Juno Park, Yongin-si (KR); Seok Heo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 158 days.

(21) Appl. No.: 16/906,820

(22) Filed: Jun. 19, 2020

(65) Prior Publication Data
US 2021/0098274 A1    Apr. 1, 2021

(30) Foreign Application Priority Data
Oct. 1, 2019    (KR) .......................... 10-2019-0121569

(51) Int. Cl.
*H01L 21/67*    (2006.01)
*H01L 21/677*    (2006.01)
*H01L 23/544*    (2006.01)
*G01B 11/14*    (2006.01)

(52) U.S. Cl.
CPC ........ *H01L 21/67706* (2013.01); *G01B 11/14* (2013.01); *H01L 21/67259* (2013.01); *H01L 23/544* (2013.01); *H01L 2223/54493* (2013.01)

(58) Field of Classification Search
None
See application file for complete search history.

(56) References Cited

U.S. PATENT DOCUMENTS

| | | | |
|---|---|---|---|
| 5,917,601 A | 6/1999 | Shimazaki et al. | |
| 6,400,445 B2* | 6/2002 | Nishi | G03F 7/70691 355/53 |
| 9,275,886 B2 | 3/2016 | Fujimoto et al. | |
| 2004/0151574 A1* | 8/2004 | Lu | H01L 21/681 414/816 |
| 2006/0100740 A1* | 5/2006 | Sakiya | H01L 21/681 700/246 |

(Continued)

FOREIGN PATENT DOCUMENTS

| | | |
|---|---|---|
| JP | 07288276 A | * 10/1995 |
| JP | H0864654 A | 3/1996 |

(Continued)

*Primary Examiner* — Gerald McClain
(74) *Attorney, Agent, or Firm* — Muir Patent Law, PLLC (57) ABSTRACT

An apparatus for transferring a wafer includes a main body, a first support installed in the main body, a sensor support fixed to the first support, a finger member slidably installed along the first support to transfer the wafer and positioned at a lower level than the sensor support, three sensors each including a light emitter installed on the first support and a light receiver installed on the sensor support, the three sensors respectively configured to detect three points of an edge of the wafer seated on the finger member, and a controller connected to the three sensors, wherein the controller is configured to determine whether any of the three points of the edge of the wafer is detected from a notch of the wafer based on signals received from the sensors.

15 Claims, 8 Drawing Sheets

(56) References Cited

U.S. PATENT DOCUMENTS

| | | | |
|---|---|---|---|
| 2012/0046904 A1* | 2/2012 | Hayashi | H01L 21/681 702/150 |
| 2017/0092520 A1* | 3/2017 | Kim | H01L 23/544 |
| 2020/0091085 A1* | 3/2020 | Mooring | H01L 21/67259 |
| 2020/0167946 A1* | 5/2020 | Kwon | H01L 21/67259 |

FOREIGN PATENT DOCUMENTS

| | | | |
|---|---|---|---|
| JP | 2002246444 A | | 8/2002 |
| JP | 2006351884 A | | 12/2006 |
| JP | 2011181755 A | * | 9/2011 |
| JP | 5284486 B2 | | 9/2013 |
| JP | 5477053 B2 | | 4/2014 |
| KR | 10-2010-0026743 A | | 3/2010 |
| KR | 20100026743 A | * | 3/2010 |
| KR | 10-2016-0030143 A | | 3/2016 |

\* cited by examiner

APPARATUS FOR TRANSFERRING WAFER, METHOD FOR TRANSFERRING WAFER USING THE SAME WITH THREE SENSORS

CROSS-REFERENCE TO RELATED APPLICATION

This application claims benefit of priority under 35 U.S.C. § 119 to Korean Patent Application No. 10-2019-0121569, filed on Oct. 1, 2019, with the Korean Intellectual Property Office, the disclosure of which is incorporated herein by reference in its entirety.

BACKGROUND

1. Field

The present invention relates to an apparatus for transferring a wafer and a method for transferring the wafer using the same. The present disclosure also relates a method of manufacturing a semiconductor device using the apparatus and/or the method of transferring the wafer.

2. Description of Related Art

In general, a photolithography process is a process of forming a desired pattern on a wafer. The photographic process undertakes an application process of a photoresist material on the wafer, an exposure process of the photoresist material layer to a light and a development process of the photoresist layer to form a pattern, which are sequentially performed. When a process performed on a wafer is completed in a machine, the wafer is transferred to the next process/machine through a separate wafer transfer device.

During the transfer of the wafer, the wafer may not be disposed in an intended position, which may cause a problem in a following process to be performed on the wafer. Accordingly, it is beneficial to examine whether the wafer is in the target position before transferring the wafer.

SUMMARY

An aspect of the present disclosure is to provide an apparatus for transferring a wafer capable of reducing measurement errors of a wafer center due to a notch and a method for transferring the wafer using the same.

According to an aspect of the present disclosure, an apparatus for transferring a wafer includes a main body; a first support installed in the main body; sensor support fixed to the first support; a finger member slidably installed along the first support to transfer the wafer and positioned at a lower level than the sensor support; three sensors each including a light emitter installed on the first support and a light receiver installed on the sensor support, the three sensors respectively configured to detect three points of an edge of the wafer seated on the finger member; and a controller connected to the three sensors, wherein the controller is configured to determine whether any of the three points of the edge of the wafer is detected form a notch of the wafer based on signals received from the sensors.

According to an aspect of the present disclosure, a method of transferring a wafer includes steps of detecting three points in an edge portion of the wafer, determining whether at least one of the three points is detected from a notch of the wafer, moving the wafer in a first direction when at least one of the three points is detected from the notch, redetecting three points of the edge portion of the moved wafer and determining whether a center of the wafer is able to be determined through the redetected three points.

According to an aspect of the present disclosure, a method of transferring a wafer includes steps of detecting three points of an edge portion of the wafer, determining whether at least one of the three points has been detected from a notch of the wafer, and determining a center of the wafer using two of the three points of the edge portion of the detected wafer when all of the three points are detected from the edge portion other than the notch of the wafer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, preferred embodiments of the present disclosure will be described in detail with reference to the accompanying drawings.

Figure 1:
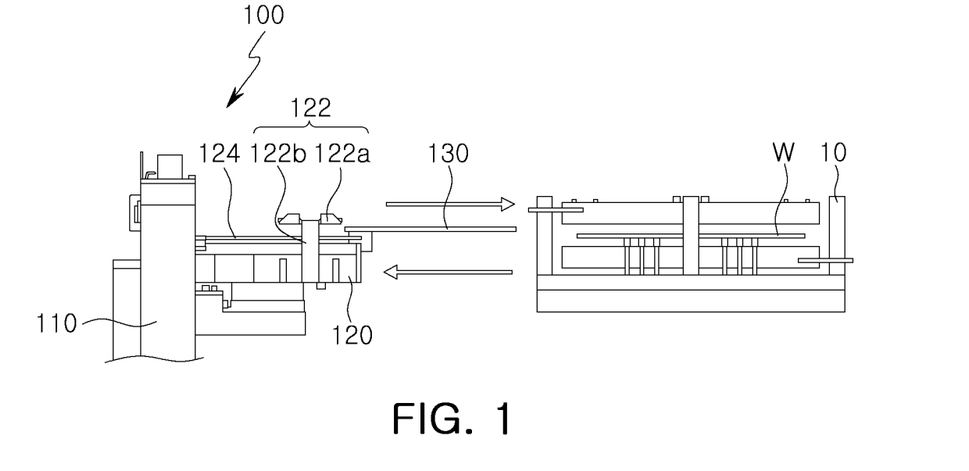
FIG. 1 is a front view illustrating a wafer transferring apparatus according to an exemplary embodiment.
Figure 2:
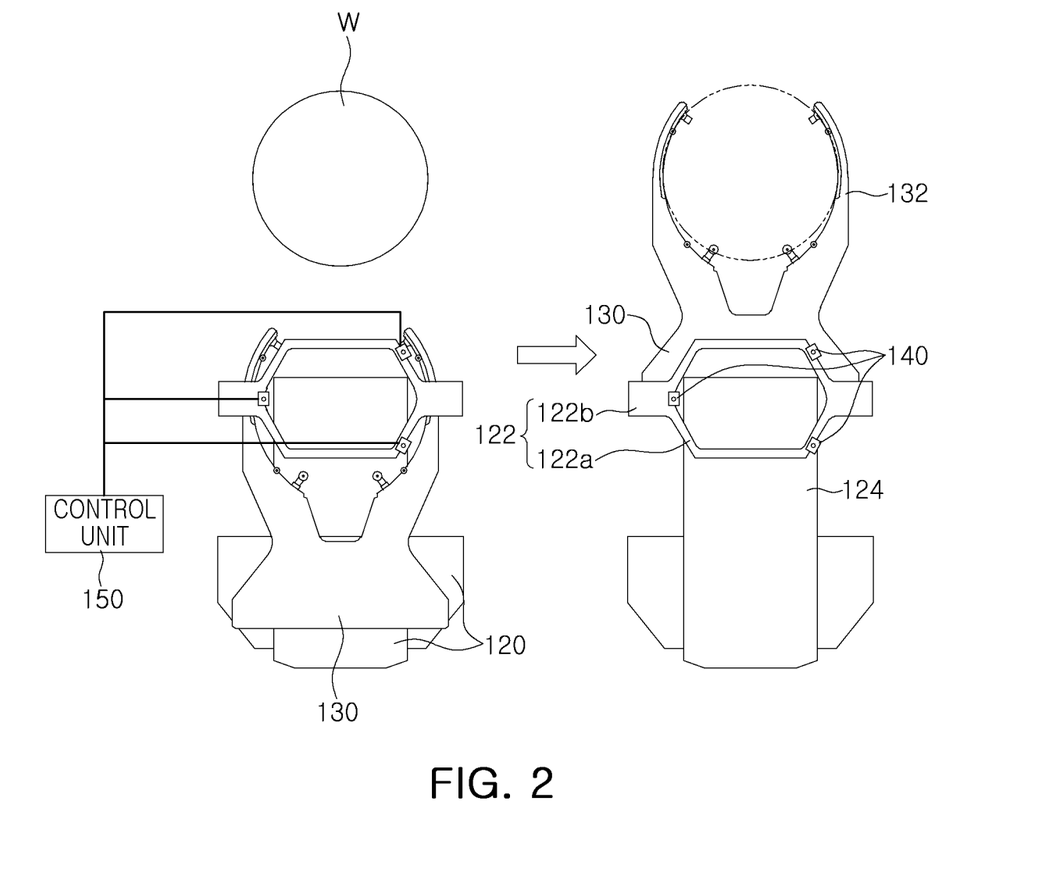
FIG. 2 is a partial plan view of a wafer transferring apparatus according to an exemplary embodiment.
Figure 3:
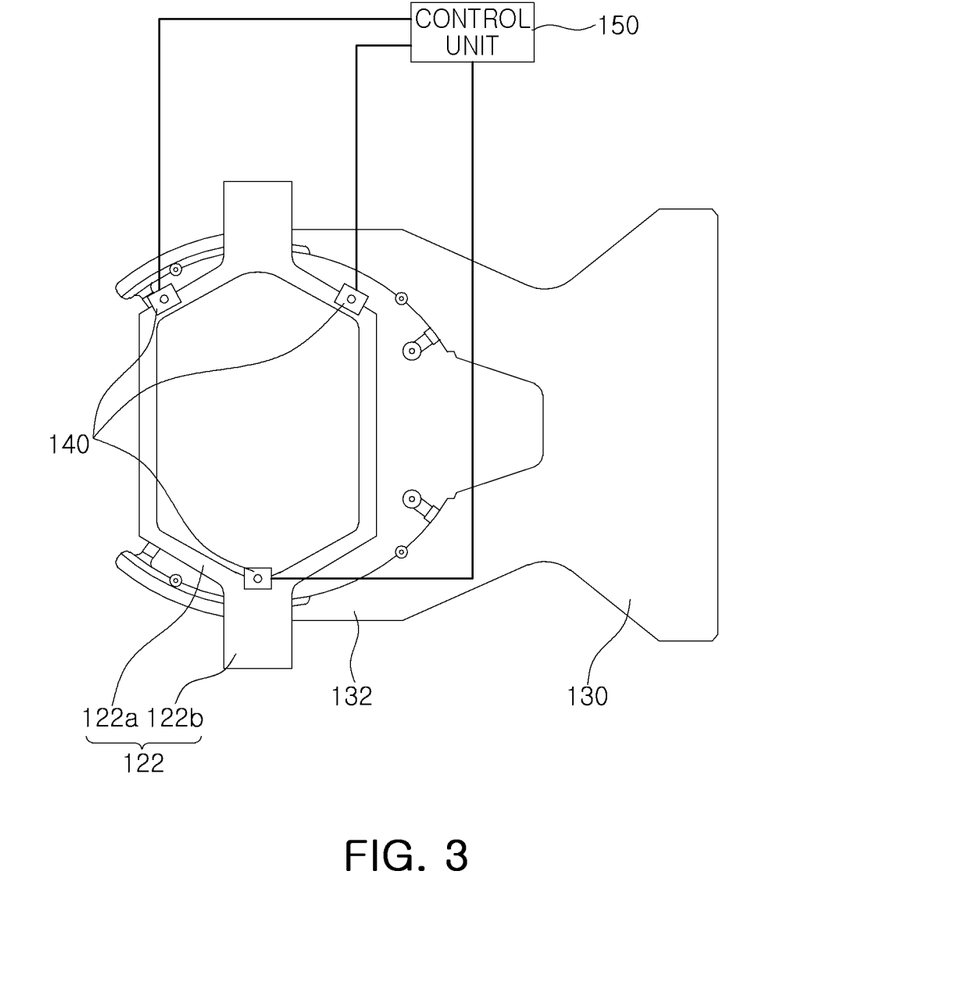
FIG. 3 is an illustrative diagram of a finger member according to an embodiment.
Figure 4:
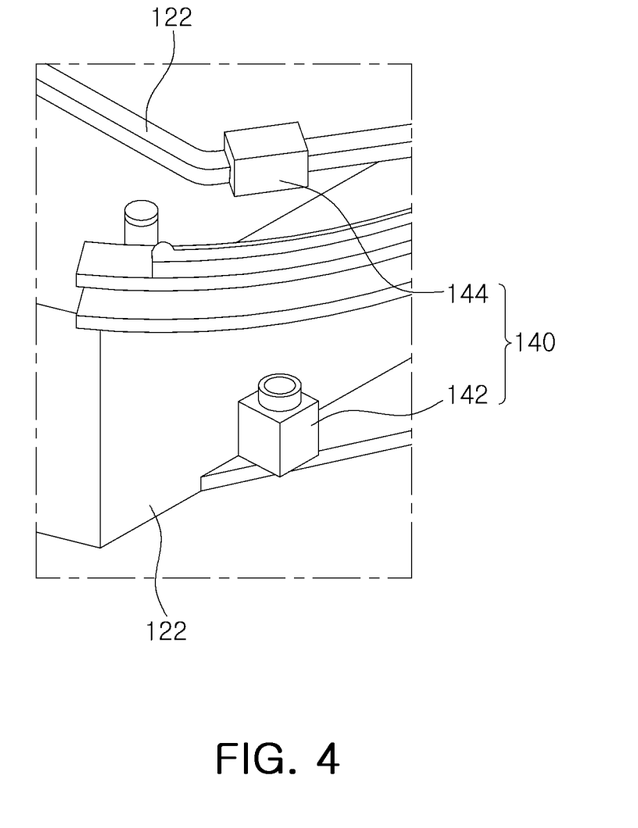
FIG. 4 is an illustrative diagram of a sensor according to an embodiment.

FIG. 1 is a front view illustrating a wafer transferring apparatus according to an exemplary embodiment, and FIG. 2 is a partial plan view of a wafer transferring apparatus according to an exemplary embodiment. FIG. 3 is an illustrative diagram of a finger member, and FIG. 4 is an illustrative diagram of a sensor.

Based on FIGS. 1 to 4, a wafer transferring apparatus 100 takes out a wafer W received in a carrier 10 and transfers the wafer to a process chamber (not illustrated).

The wafer transferring apparatus 100 may include a main body 110, a support unit 120, a finger member 130, a sensor 140 (see FIG. 2) and a control unit 150 (see FIG. 2).

The support unit 120 may be installed in the main body 110 and may move up and down and rotate. As an example, an installation member 122 on which the sensor 140 is installed may be installed in the support unit 120. For example, the support unit 120 may be a support on which the installation member 122 is attached. The installation member 122 may be a sensor support on which a light receiver 144 of the sensor 140 is installed. For example, three light receivers 144 of the sensors 140 may be installed on the sensor support (the installation member) 122. The installation member 122 may include a band portion 122a having a hexagonal band shape and an extension portion 122b extending from the band portion 122a and bent to be fixed to a side surface of the support unit 120.

For example, the band portion 122a may have a closed polygonal shape, e.g., a hexagonal shape or an octagonal shape. For example, the band portion 122a may have a narrow width compared to the length and/or width of the inner area enclosed by the polygonal of the band portion 122a in a plan view. For example, a width of the band portion 122a may be less than one tenth of the width and/or length of the inner area enclosed by the band portion 122a in a plan view. For example the width may be a distance perpendicular to an extending direction of the band portion 122a. In some embodiments, the band portion 122a may have a circular shape, an oval shape or an ellipse shape. For example, the band portion 122a may have a closed figure shape. In certain embodiments, the band portion 122a may have an open shape. For example, the band portion 122a may have an open shape corresponding to the above mentioned polygons or other figures.

The band portion 122a may be spaced apart from an upper surface of the support unit 120. When the finger member 130 is placed at a normal/original position, the finger member 130 may be disposed in a space between an upper surface of the support unit 120 and the band portion 122a. For example, the finger member 130 may be placed above the upper surface of the support unit 120 and the band portion 122a may be placed above the finger member 130. For example, the finger member 130 may be at a lower level than the installation member 122.

As previously described, the support unit 120 may move vertically along the main body 110 and may be rotatably installed in the main body 110 about the main body 110. For example, the support unit 120 may rotate around the main body 110. The support unit 120 may also be connected to a support unit-driving unit (not illustrated) to move up and down and to be rotatably operated. For example, the driving unit may drive the support unit 120 to move up and down and to rotate around the main body 110.

Accordingly, the wafer seated on the finger member 130 may be transferred to a desired/target position.

A guide member 124 for guiding a movement of the support unit 120 may be equipped in the support unit 120. For example, the guide member 124 may determine a proper movement route/track of the support unit 120 while the support unit 120 moves back and forth.

The finger member 130 is slidably installed in the support unit 120 and may be moved forwards and backwards along the support unit 120. To this end, a finger member-driving unit (not illustrated) may be connected to the finger member 130. The finger member 130 may be provided with a finger portion 132 for supporting a bottom edge of the wafer, and the finger portion 132 may have an approximation of a circular band shape, a portion of which is open. For example, the finger portion 132 may have an analogy of a circular shape having an opening from a circular shape. For example, the finger portion 132 may include two branches connected together to form the analogy of the circular shape.

The sensor 140 may be installed in the installation member 122 and the support unit 120. Three of the sensors 140 may be spaced apart from each other. As an example, the sensor 140 may be provided with a light-emitting portion 142 installed on the support unit 120 and a light-absorbing portion 144 installed on the installation member 122. For example, the sensor 140 may include a pair of the light-emitting unit/portion 142 and the light-absorbing unit/portion 144, and a total of three pairs of the sensors 140 may be installed in the support unit 120 and the installation member 122. For example, the light-emitting portion 142 may be a light emitter of the sensor 140, and each of the light-absorbing units 144 may be a light receiver of the sensor 140 which receives light emitted from the light emitter 142. The sensor 140 may be disposed to detect an edge of the wafer W. For example, when the finger member 130 moves to an original/target position while the wafer is seated on the finger member 130, the sensor 140 may detect the edge of the wafer W.

The control unit 150 may be connected to the sensor 140. As an example, the control unit 150 may determine whether a notch in the edge portion of the wafer W is detected through a signal from the sensor 140. Further, the control unit 150 may calculate a deviation amount of the wafer W, which is a distance from the normal/target position to the detected position, through the signal from the sensor 140.

A detailed description in this regard will be described in more detail when describing a wafer transferring method below.

Figure 5:
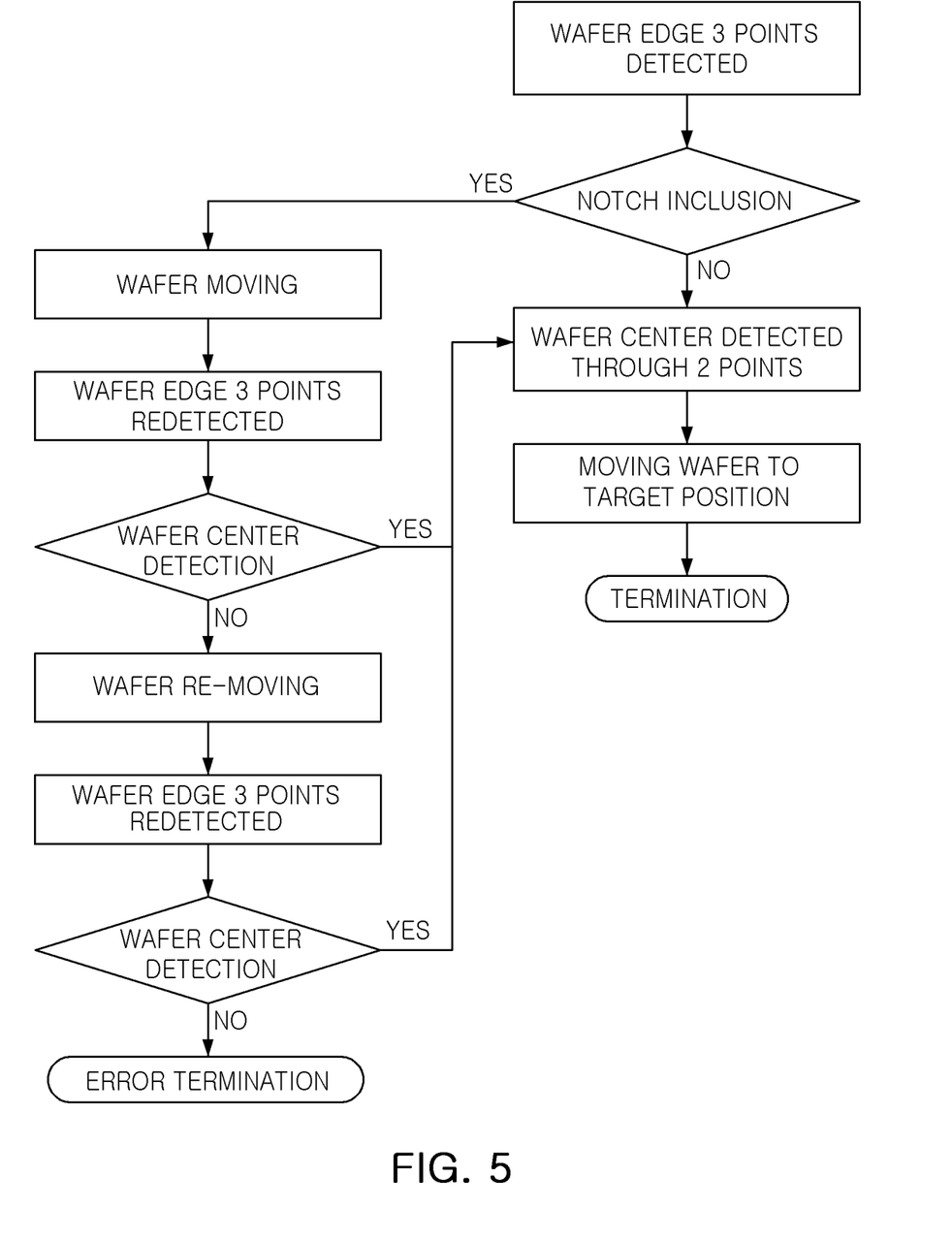
FIG. 5 is a flow chart illustrating a wafer transferring method according to an exemplary embodiment.

FIG. 5 is a flow chart illustrating a wafer transferring method according to an exemplary embodiment.

Based on FIG. 5, a wafer is seated on a finger member 130 (see FIG. 3) of a wafer transferring apparatus 100 (see FIG. 1). Three points are then detected from an edge portion of the wafer through three sensors 140 (see FIG. 3) installed in the wafer transferring apparatus 100.

Figure 6:
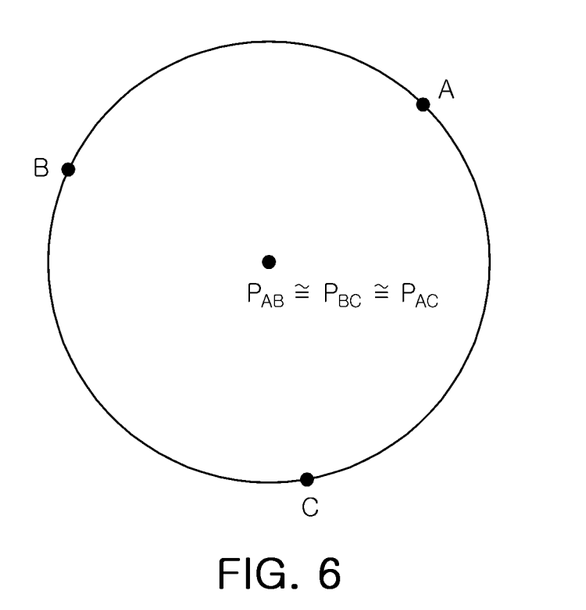
FIG. 6 is an illustrative diagram of a case in which all of three points detected from an edge portion of a wafer are detected from edges other than a notch of the wafer.

Whether any one point among the three points detected by the three sensors 140 is in a notch of the wafer is examined/determined. For example, combinations of two points among the three points may be used to detect a center of the wafer. For example, three combinations of two points among the three points detected by the sensors 140 may be used to calculate respective presumptive centers of the wafer. As illustrated in FIG. 6, three centers $P_{AB}$, $P_{BC}$ and $P_{AC}$ of the wafer calculated by the combination of the two points may be located in positions almost the same as the actual centers of the wafer when the three points in the edge portion of the wafer are not detected from the notch. In this case, the control unit 150 may determine that the notch is not included in the three points in the edge portion of the detected wafer. For example, the three centers $P_{AB}$, $P_{BC}$ and $P_{AC}$ of the wafer produced by the detected three points may be at the same point or may be within a margin of error when the detected three points are all on non-notch edges of the wafer.

Figure 7:
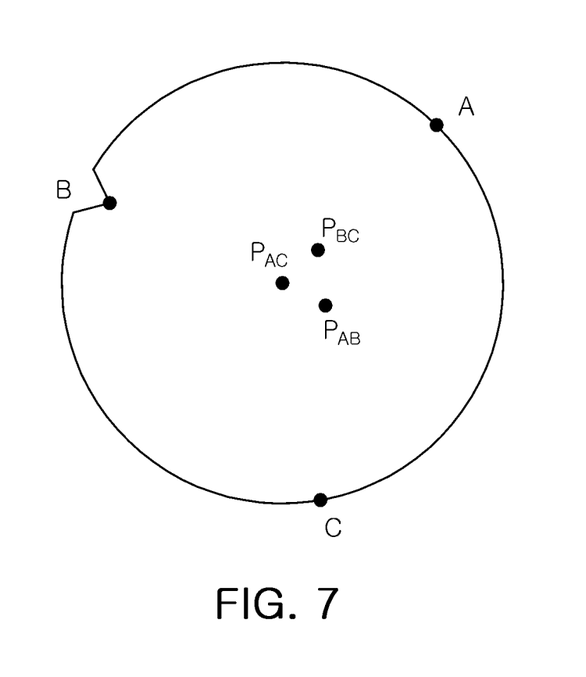
FIG. 7 is an illustrative diagram of a case in which one of three points detected from an edge portion of a wafer is detected from a notch of the wafer.

As illustrated in FIG. 7, the three centers $P_{AB}$, $P_{BC}$ and $P_{AC}$ of the wafer calculated by the respective combinations of the two points may be spaced apart, e.g., beyond the margin of error, when one point is detected from the notch among the three points of the wafer. In this case, the control unit 150 may determine that one point is detected from the notch among the three points detected by the sensors 140.

Figure 8:
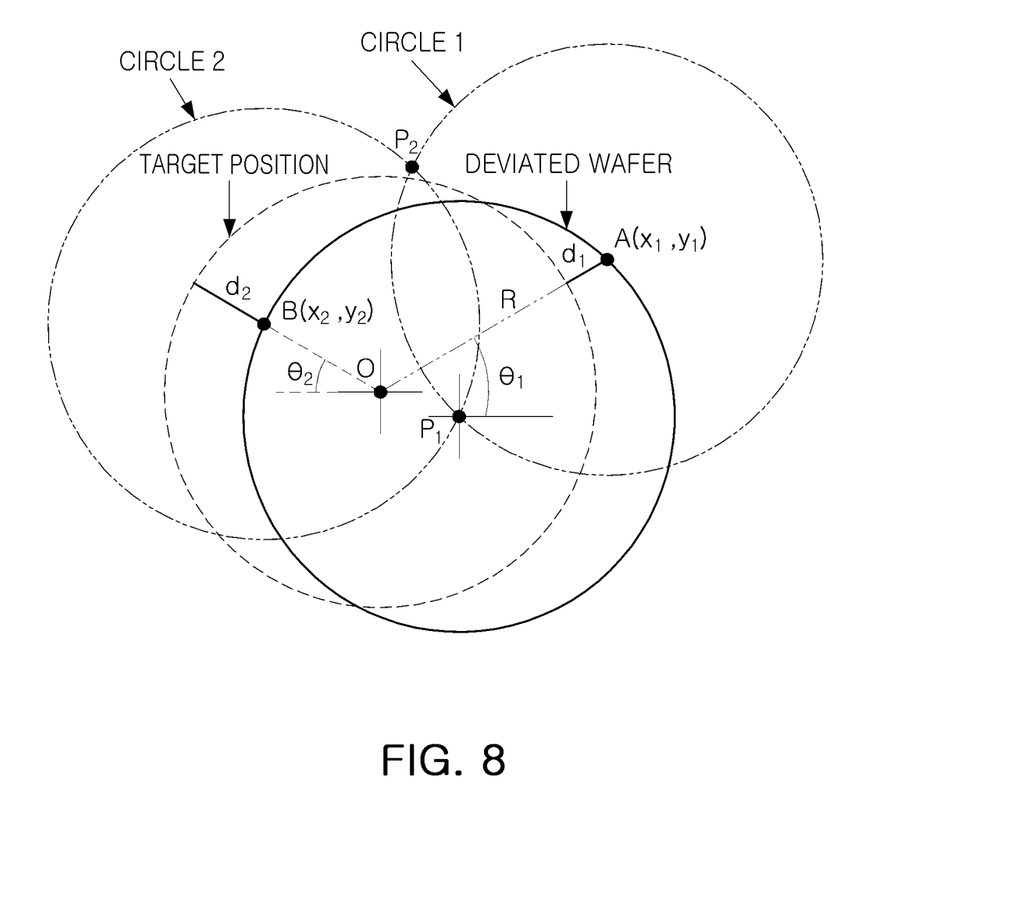
FIG. 8 is an illustrative diagram of a method for calculating a center and a deviation amount of a wafer through 2 points detected from an edge portion of a wafer.

When it is determined that all of the three detected points of the edge portion of the wafer are detected from non-notch edges, the wafer center may be calculated using any two points among the detected three points. For example, as illustrated in FIG. 8, detected two points A and B may be two edge positions of the wafer. The position of the wafer may be deviated from a target position of the wafer having a radius R and center O. The position of the detected edge point A of the wafer may be calculated with respect to the center O of the target position of the wafer as follows:

$$x_1 = (R+d_1)\cos\theta_1; \text{ and}$$

$$y_1 = (R+d_1)\sin\theta_1.$$

Similarly, the position of the detected edge point B of the wafer may be calculated with respect to the center O of the target position of the wafer as follows:

$$x_2 = (R-d_2)\cos\theta_2; \text{ and}$$

$$y_2 = (R-d_2)\sin\theta_2.$$

Here, the center O of the target position of the wafer may correspond to the origin of the corresponding coordinate system.

As A and B are the edge positions on the deviated wafer whose radius is R, two circles whose radius is R and having respective centers at A and B as centers always pass the center of the deviated wafer. Accordingly, one of intersection points of the two circles becomes the center of the wafer. Therefore, the respective circle equations are as follows:

$$(x-x_1)^2 + (y-y_1)^2 = R^2; \text{ and} \qquad \text{Circle 1 Equation:}$$

$$(x-x_2)^2 + (y-y_2)^2 = R^2. \qquad \text{Circle 2 Equation:}$$

Two intersection points $P_1$ and $P_2$ may be calculated via two circle equations above. The intersection point $P_1$ positioned closer to a center O of a target position of the wafer than the other point $P_2$ may be detected as a center of the wafer using a range in which a deviation amount and a displacement value, which can be measured by the sensor. For example, determining the center of the wafer between the two intersection points $P_1$ and $P_2$, detection ranges of the sensors 140 and probability of wafer deviation may be referenced.

The control unit 150 then may calculate a distance between the center O of the reference wafer (e.g., disposed at the target position) and the center of the wafer and may control the wafer when transferring the wafer to compensate for the distance and move the wafer to the normal/target position.

Figure 9:
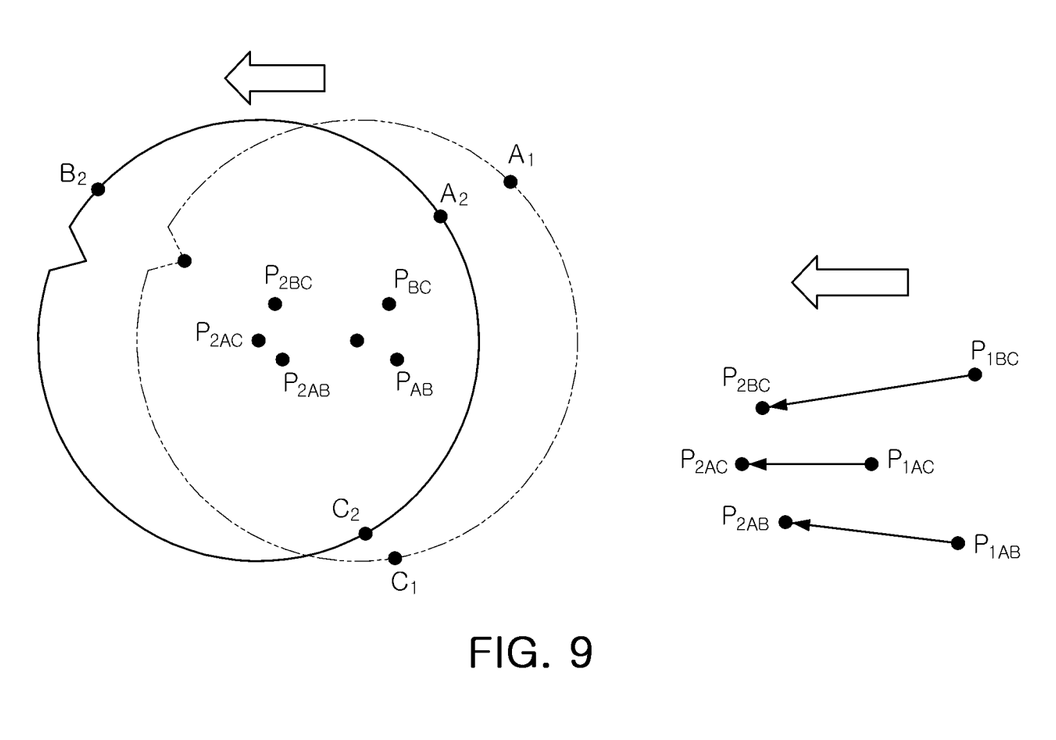
FIG. 9 is an illustrative diagram of a method for determining whether a wafer center is able to be calculated through three redetected points in an edge portion of a wafer after the wafer is transferred when one of three detected points in an edge portion of a wafer is detected from a notch of the wafer.

When it is determined that one of the detected three points is on the notch of the wafer, the control unit 150 may control the wafer transferring apparatus 100 and move the wafer, as illustrated in FIG. 9. Three points $A_2$, $B_2$ and $C_2$ of the edge portion of the wafer may be then redetected via the three sensors 140, followed by calculating three centers $P_{2AB}$, $P_{2BC}$ and $P_{2AC}$ of the calculated wafer by combinations of respective two points of the three redetected points.

Among three redetected centers $P_{2AB}$, $P_{2BC}$ and $P_{2AC}$, a center of a circle moved in a direction and a distance identical or similar to the moving direction and the moving distance of the wafer may be calculated/selected as a center of the wafer.

The center position of the wafer may be calculated/confirmed using the two points of the three detected points. For example, the range of a deviation amount and a displacement value, which can be measured by the sensor 140, may be used to detect/determine the intersection point $P_1$ positioned closer to a center O of a reference wafer (e.g., disposed at the target position) than the other intersection point $P_2$ as the center of the wafer. For example, determining the center of the wafer between the two intersection points $P_1$ and $P_2$, detection ranges of the sensors 140 and probable deviation ranges of wafer may be referenced.

The control unit 150 then may calculate a distance between the center of the wafer and the center O of the reference wafer (e.g., disposed at the target position) and may control the wafer transferring apparatus 100 when transferring the wafer to compensate for the calculated distance and move the wafer to the normal/target position.

Figure 10:
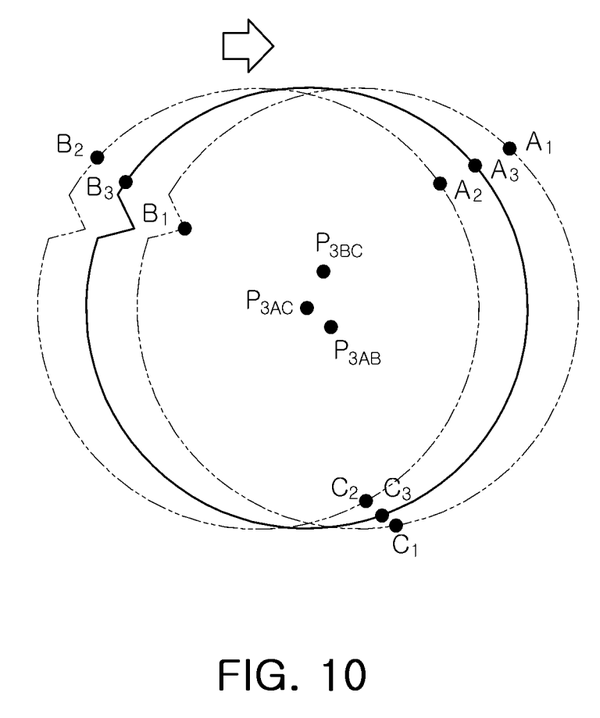
FIG. 10 is an illustrative diagram of a method for determining whether a wafer center is able to be calculated through three redetected points in an edge portion of a wafer after the wafer is transferred when a wafer center is not calculated through three redetected points in an edge portion of a wafer.

As illustrated in FIG. 10, the control unit 150 may control the wafer transferring apparatus 100 and may move the wafer again when an error occurs in detecting the center of the wafer after the movement. For example, two or more center points among the three redetected centers $P_{2AB}$, $P_{2BC}$ and $P_{2AC}$ falls within a pre-determined range (e.g., in an error range), and one proper center point is not calculated/determined. In this case, the wafer may be moved in a direction opposite to the direction of wafer movement for the redetection of the three points, and a movement distance may be ½ thereof.

Three points $A_3$, $B_3$ and $C_3$ of the edge portion of the wafer may be re-redetected through the three sensors 140, and three centers $P_{3AB}$, $P_{3BC}$ and $P_{3AC}$ of the wafer may be calculated by respective combinations of two points of the three re-redetected points. A center of the circle moved in a direction and a distance identical or similar to the moving direction and the moving distance of the wafer may be calculated/determined as the center of the actual wafer.

The wafer center may be calculated using the two points of the detected three points. For example, the intersection point $P_1$ positioned closer to a center O of a reference wafer (e.g., disposed at the target position) than the other point $P_2$ may be detected/determined as a center of the wafer using a range of a deviation amount and a displacement value, which can be measured by the sensor 140. For example, determining the center of the wafer between the two intersection points $P_1$ and $P_2$, detection ranges of the sensors 140 and probability of wafer deviation may be referenced.

The control unit 150 then may calculate a distance between the center O of the reference wafer (e.g., disposed at the target position) and the center of the wafer and may control the wafer when transferring the wafer to compensate for the distance and move the wafer to the normal/target position.

The control unit 150 may pause an operation of the wafer transferring apparatus 100 and may indicate/produce an error message when an error occurs in the movement of two or more center points among the three re-redetected centers $P_{3AB}$, $P_{3BC}$ and $P_{3AC}$, e.g., when the calculated center positions fall within a pre-determined range and one proper center point is not calculated/determined. For example, the control unit 150 may be a controller performing all of the functions described above.

As previously described, two sensors 140 may be used to calculate the center point of the wafer, and three sensors 140 may be used to detect an accurate position of the wafer including the notch. Further, a deviation amount of the positions of the actual wafer from the target position of the wafer including a center point at a pre-determined position may be calculated, and based thereon, a transferring position may be revised when transferring the wafer using the wafer transferring apparatus 100, thereby enabling the wafer to be accurately transferred to a target position.

As set forth above, an apparatus for transferring a wafer capable of reducing measurement errors of a wafer center position caused by a notch, and a method for transferring a wafer using the same may be provided.

A method of manufacturing a semiconductor device will be described below according to an embodiment of the present disclosure.

The method may include forming various patterns on the wafer described above. The patterns on the wafer may include a plurality of conductive pattern layers and a plurality of insulator layers. The patterns may be formed on the wafer before the wafer is transferred by the apparatus described above and/or may be formed on the wafer after the wafer is transferred by the apparatus. For example, the wafer may be transferred multiple times by the same apparatus or by different apparatuses performing the same function/method described above. After various patterns are formed on the wafer, the wafer may be diced for semiconductor devices formed on the wafer to be singulated. The singulated semiconductor devices may be packaged by a package process. For example, the semiconductor device may be a memory device, a microprocessor or an application specific integrated circuit (ASIC) device.

While example embodiments have been shown and described above, it will be apparent to those skilled in the art that modifications and variations could be made without departing from the scope of the present disclosure as defined by the appended claims.

What is claimed is:

1. An apparatus for transferring a wafer, comprising:
a main body;
a first support installed in the main body;
a sensor support fixed to the first support;
a finger member slidably installed along the first support to transfer the wafer and positioned at a lower level than the sensor support;
three sensors each including a light emitter installed on the first support and a light receiver installed on the sensor support, the three sensors respectively configured to detect three points of an edge of the wafer seated on the finger member; and
a controller connected to the three sensors,
wherein the controller is configured to determine whether any of the three points of the edge of the wafer is detected from a notch of the wafer based on signals received from the sensors,
wherein the controller is configured to redetect three points of the edge of the wafer when at least one of the three detected points is detected from the notch of the wafer,
wherein among centers of three circles measured through a combination of two of the three redetected points, a center of a circle moved in a direction and a distance identical to or within predetermined ranges from a moving direction and a moving distance of the wafer is determined as a center of the wafer,
wherein the controller is configured to move the wafer again to re-redetect three points of the edge of the wafer when the center of the wafer is not determined by the redetected three points, and
wherein a direction of wafer movement after the redetection is opposite to a direction of wafer movement before the redetection of the three points of the edge of the wafer.

2. The apparatus of claim 1, wherein each of the three sensors accommodates a light-receiver installed on the sensor support, and a light emitter installed on the first support so as to oppose the light receiver.

3. The apparatus of claim 2, wherein the sensor support has a band portion having a polygon shape or a closed figure shape, and an extension portion installed on the first support.

4. The apparatus of claim 1, wherein the sensor support has a band portion having a polygon shape or a closed figure shape, and each of the light receivers is installed on the band portion.

5. The apparatus of claim 1, wherein the controller is configured to determine whether any of the three points of the edge of the wafer is detected from the notch based on whether centers of three circles calculated through combinations of respective two points among the three points of the edge of the wafer are disposed within a predetermined distance.

6. The apparatus of claim 1, wherein the controller is configured to determine a center of the wafer using two of the three detected points when all of the three detected points are detected from edges other than the notch of the wafer.

7. A method for transferring a wafer, comprising:
detecting three points in an edge portion of the wafer;
determining whether at least one of the three points is detected from a notch of the wafer;
moving the wafer in a first direction when at least one point is detected from the notch;
redetecting three points of the edge portion of the moved wafer;
determining whether a center of the wafer is able to be determined through the redetected three points,
in the case in which all of the three points of the edge portion are detected from edges other than the notch of the detected wafer, determining a center of the wafer using two of the three points of the edge portion of the detected wafer;
calculating two intersection points of two circles each of which having a radius the same as a radius of the wafer, the two circles respectively having centers of the circles at the two detected points; and
determining an intersection point closer to the center of a target position of the wafer as the center of the wafer.

8. The method of claim 7, further comprising, in the case in which the center of the wafer is not able to be determined through the three redetected points:
transferring the wafer in a second direction opposite to the first direction of wafer movement;
re-redetecting three points of the edge portion of the transferred wafer; and
determining whether the center of the wafer is able to be determined through the three re-redetected points.

9. The method of claim 8, further comprising, in the case in which the center of the wafer is able to be determined through the three re-redetected points:
determining the center of the wafer using two of the three points of the edge portion of the detected wafer; and
calculating a distance between the center of the detected wafer and a center of a target position of the wafer and compensating for the distance measured by moving the wafer to the target position.

10. The method of claim 8, wherein the wafer movement in the second direction involves a half of the moving distance of the wafer movement in the first direction.

11. The method of claim 7, further comprising, in the case in which the center of the wafer is able to be determined through the three redetected points:
determining the center of the wafer using two points among the three points of the edge of the redetected wafer; and
measuring a distance between the center of the detected wafer and a center of a target position of the wafer and compensating for the distance measured by moving the wafer to the target positon.

12. The method of claim 7, wherein the determination of whether the center of the wafer is able to be determined through the three redetected points employs calculating centers of three circles measured through combinations of two points among the three redetected points, and a center of a circle moved in a direction and a distance identical to or within predetermined ranges from a moving direction and a moving distance of the wafer is determined as a center of the wafer.

13. The method of claim 7, further comprising calculating a distance between the center of the detected wafer and a center of a target position of the wafer and compensating for the distance measured by moving the wafer to the target position, after detecting the center of the wafer using the two points.

14. A method for transferring a wafer, comprising:
   detecting three points of an edge portion of the wafer;
   determining whether at least one of the three points has been detected from a notch of the wafer;
   determining a center of the wafer using two of the three points of the edge portion of the detected wafer when all of the three points are detected from the edge portion other than the notch of the wafer,
   calculating two intersection points of two circles each of which having a radius the same as a radius of the wafer, the two circles respectively having centers of the circles at the two detected points of the wafer; and
   determining an intersection point closer to the center of a target position of the wafer as the center of the wafer.

15. The method of claim 14, further comprising calculating a distance between the center of the detected wafer and a center of a target position of the wafer and compensating for the distance measured by moving the wafer to move the wafer to the target position, after detecting the center of the wafer using the two points.

* * * * *